(12) United States Patent
Kubo et al.

(10) Patent No.: US 8,279,521 B2
(45) Date of Patent: Oct. 2, 2012

(54) OPTICAL DEVICE AND LASER MICROSCOPE

(75) Inventors: Hirokazu Kubo, Hino (JP); Makio Ueno, Nagano (JP)

(73) Assignee: Olympus Corporation, Tokyo (JP)

( * ) Notice: Subject to any disclaimer, the term of this patent is extended or adjusted under 35 U.S.C. 154(b) by 80 days.

(21) Appl. No.: 12/255,021

(22) Filed: Oct. 21, 2008

(65) Prior Publication Data

US 2009/0122397 A1 May 14, 2009

(30) Foreign Application Priority Data

Nov. 9, 2007 (JP) .................................. 2007-292413

(51) Int. Cl.
*G02B 21/00* (2006.01)
*G02B 21/06* (2006.01)

(52) U.S. Cl. ..................... 359/376; 359/368; 359/386

(58) Field of Classification Search .......... 359/368–390, 359/483–502, 285–289, 483.01–494.01
See application file for complete search history.

(56) References Cited

U.S. PATENT DOCUMENTS

| | | | | |
|---|---|---|---|---|
| 3,700,307 A | * | 10/1972 | Glenn | 359/497 |
| 4,643,575 A | * | 2/1987 | Hazeltine et al. | 356/487 |
| 5,031,182 A | * | 7/1991 | Anthon et al. | 372/31 |
| 5,355,252 A | | 10/1994 | Haraguchi | |
| 5,359,622 A | * | 10/1994 | Shih | 372/108 |
| 5,381,437 A | * | 1/1995 | Kuwabara et al. | 372/98 |
| 5,504,619 A | * | 4/1996 | Okazaki | 359/495 |
| 6,456,315 B1 | | 9/2002 | Shinada | |
| 2006/0238865 A1 | | 10/2006 | Biss et al. | |

FOREIGN PATENT DOCUMENTS

JP 2004-151491 A 5/2004

OTHER PUBLICATIONS

D.L. Wokosin et al; Characterization of a Range of Fura Dyes With Two-Photon Excitation; Biophysical Journal vol. 86, Mar. 2004, pp. 1726-1738.
Extended European Search Report (EESR) dated Nov. 3, 2011 (in English) in counterpart European Application No. 08018490.6.

* cited by examiner

*Primary Examiner* — Thong Nguyen
(74) *Attorney, Agent, or Firm* — Holtz, Holtz, Goodman & Chick, PC

(57) ABSTRACT

The present invention is low cost, does not exert a negative influence on the surroundings, has a small group-velocity delay dispersion, efficiently blocks reflected return light such that the laser light does not return to the laser light source, and allows properly polarized laser light to enter a polarization-dependent element in a subsequent stage. An optical device is provided which includes a laser light source, an optical system that transmits laser light emitted from the laser light source, and a polarization-dependent element into which the laser light transmitted by the optical system enters. The characteristics of outgoing light are changed according to a polarization state of the incident light. The optical system includes a reflected-light generator that reflects a part of the transmitted laser light, and λ/4 wave plates are disposed such that the reflected-light generator is disposed therebetween.

9 Claims, 4 Drawing Sheets

OPTICAL DEVICE AND LASER MICROSCOPE

BACKGROUND OF THE INVENTION

1. Field of the Invention

The present invention relates to an optical device and a laser microscope.

This application is based on Japanese Patent Application No. 2007-292413, the content of which is incorporated herein by reference.

2. Description of Related Art

In a conventionally known technique, an optical isolator is disposed in the subsequent stage of a laser light source, for preventing the problem of unstable laser oscillation, causing a failure, because of part of the laser light emitted from the laser light source and transmitted to a two-photon excitation microscope is reflected, at a midpoint in the transmission, back to the laser light source (for example, refer to D. L. Wokosin, et al., "Characterization of Range of Fura Dyes with Two-Photon Excitation", Biophysical Journal, Volume 86, March 2004, p 1726-1738).

However, an optical isolator is not only inefficient, but is also an expensive means for preventing reflected return light occurring when laser light over a wide wavelength range is transmitted. Further, because it is driven by magnetic force, it may create a magnetic field around itself, which exerts a negative influence on the surroundings. In addition, when a femtosecond pulsed laser light source is used as the laser light source, as in a two-photon excitation microscope. Sufficient compensation of the group-velocity delay dispersion needs to be performed, because it of the optical isolator is large.

BRIEF SUMMARY OF THE INVENTION

The present invention provides a low-cost optical device capable of efficiently blocking reflected return light of laser light such that it does not return to a laser light source and capable of allowing properly polarized laser light to enter a polarization-dependent element provided in the subsequent stage, and also provides a laser microscope.

A first aspect of the present invention is an optical device that includes a laser light source, an optical system that transmits the laser light emitted from the laser light source, and a polarization-dependent element into which the laser light transmitted by the optical system enters. The characteristics of outgoing light are changed according to a polarization state of the incident light. The optical system includes a reflected-light generator that reflects a part of the transmitted laser light, and λ/4 wave plates are disposed such that the reflected-light generator is disposed therebetween.

According to the first aspect, the laser light emitted from the laser light source is transmitted by the optical system and enters the polarization-dependent element. Because the optical system includes the reflected-light generator, a part of the laser light is reflected by the reflected-light generator in the midpoint of the optical system. At this time, the laser light emitted from the laser light source and transmitted is converted into circularly polarized laser light by the λ/4 wave plate disposed in the preceding stage of the reflected-light generator. The laser light converted into circularly polarized light is rotated in the opposite direction upon reflection at the reflected-light generator, is allowed to pass through the same λ/4 wave plate, and is then sent back to the laser light source as reflected laser light whose polarization direction differs from that of the incident laser light by 90°.

Accordingly, it is possible to easily block the reflected laser light by a Brewster window or the like provided in the laser light source in the same optical path as the incident laser light, whereby destabilization of laser oscillation due to the reflected laser light returning to the laser light source can be prevented.

Among the laser light converted into the circularly polarized light, a portion that is allowed to pass through the reflected-light generator without being reflected is converted back into linearly polarized light by a λ/4 wave plate disposed in the subsequent stage of the reflected-light generator. At this time, because the rotation direction of the circularly polarized light is maintained, the polarization direction of the laser light emitted from the λ/4 wave plate to the subsequent stage is maintained the same as the polarization direction of the incident laser light. Thus, it is possible to allow the linearly polarized laser light emitted from the laser light source to enter the polarization-dependent element while the proper polarization state is maintained.

Examples of the polarization-dependent element include an acousto-optic device, a negative-chirp optical system, a wavelength conversion crystal, a microscope such as a confocal microscope or a two-photon excitation microscope that includes one of the aforementioned devices etc., and a microscope such as a second-harmonic generation (SHG) microscope, a differential interference microscope, or a polarization microscope in which the state in which a specimen is observed is changed in accordance with the incident polarization.

In the first aspect, the laser light source may oscillate subpicosecond extremely short pulsed laser light.

In the first aspect, the laser light source may be a laser diode.

In these cases, in which destabilization of laser oscillation due to reflected return light tends to occur, it is possible to particularly effectively prevent such destabilization of laser oscillation from occurring.

A second aspect of the present invention is a laser microscope having any one of the above-described optical devices.

It is possible to precisely observe a specimen using laser light maintained in a properly polarized state.

DETAILED DESCRIPTION OF THE INVENTION

Figure 1:
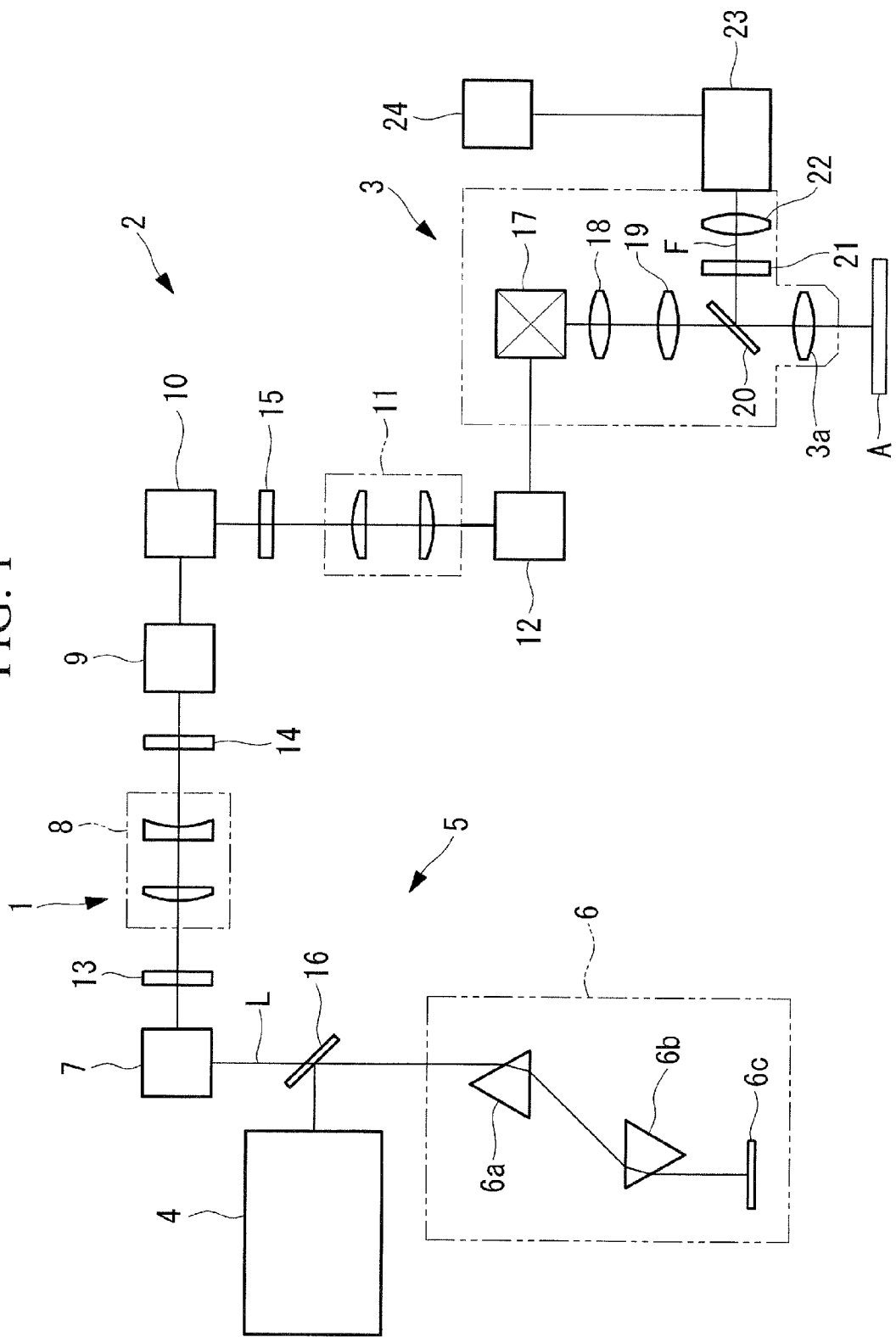
FIG. 1 schematically shows the overall configuration of a laser microscope including an optical device according to an embodiment of the present invention.

Referring to FIG. 1, an optical device 1 according to an embodiment of the present invention will be described.

As shown in FIG. 1, the optical device 1 according to this embodiment is provided in a laser microscope 2.

The laser microscope 2 includes the optical device 1 and a microscope main body 3, into which laser light L emitted from the optical device 1 enters and with which a specimen A is observed.

The optical device 1 according to this embodiment includes a femtosecond pulsed laser light source (hereinafter simply, "laser light source") 4 and an optical system 5 that transmits the pulsed laser light L emitted from the laser light source 4.

The optical system 5 includes a negative-chirp optical system 6 for compensating for the group velocity dispersion in the whole optical system including the microscope main body 3, an alignment-adjusting optical system 7 for adjusting optical axis of the pulsed laser light L emitted from the negative-chirp optical system 6, a beam-shaping optical system 8, an acousto-optic device 9, an alignment-adjusting optical system 10 for adjusting optical axis of the pulsed laser light L emitted from the acousto-optic device 9, a collimator optical system 11, an alignment-adjusting optical system 12, two $\lambda/4$ wave plates 13 and 14 disposed such that the beam-shaping optical system 8 is disposed therebetween, and a $\lambda/4$ wave plate 15 disposed in the preceding stage of the collimator optical system 11.

The negative-chirp optical system 6 is formed of, for example, a pair of prisms 6a and 6b and a mirror 6c. Alternatively, the negative-chirp optical system 6 may be formed of a pair of gratings. By adjusting the distance between the prisms 6a and 6b, or the gratings, the group velocity dispersion in the whole optical system, from the laser light source 4 to an objective lens 3a of the microscope main body 3, is compensated for.

The alignment-adjusting optical systems 7, 10, and 12 each include, for example, two mirrors (not shown) capable of adjusting the position and angle of the axis of the laser light and are configured so as to allow the pulsed laser light L to enter the acousto-optic device 9, the collimator optical system 11, and the microscope main body 3, respectively, at a proper position and angle, with high precision, after adjusting the position and angle of the optical axis of the pulsed laser light L. In FIG. 1, reference numeral 16 denotes a mirror that reflects the pulsed laser light L emitted from the laser light source 4 towards the negative-chirp optical system 6. The mirror 16 is disposed at a position shifted from the optical axis of the pulsed laser light L emitted from the negative-chirp optical system 6 in the direction perpendicular to the plane of the drawing.

The beam-shaping optical system 8 is configured to reduce the diameter of the pulsed laser light L having passed through the negative-chirp optical system 6 and having optical axis corrected by the alignment-adjusting optical system 7 to allow the pulsed laser light L to enter the active region of a crystal (not shown) of the acousto-optic device 9 without any loss.

In this embodiment, the beam-shaping optical system 8 includes, for example, a Galilean beam expander including a combination of a convex-plano lens and a plano-concave lens.

The acousto-optic device 9 is, for example, an acousto-optical modulator (AOM) that changes the diffracted intensity of the pulsed laser light L in a crystal, composed of tellurium dioxide, by changing the amplitude of an acoustic wave applied to the crystal from a transducer consisting of a piezoelectric element bonded to the crystal, thereby modulating the intensity of the pulsed laser light L to be emitted at a predetermined ratio according to the amplitude of the acoustic wave.

The collimator optical system 11 is formed of, for example, a beam expander consisting of a convex-plano lens and a plano-convex lens. The collimator optical system 11 corrects the diameter and beam divergence of the pulsed laser light L, whose diameter and divergence have been corrected by the beam-shaping optical system 8 such that the pulsed laser light L passes through the active region of the acousto-optic device 9 without any loss and whose position and angle of the optical axis have been adjusted by the alignment-adjusting optical system 12, such that the diameter and beam divergence of the pulsed laser light L are appropriate for the objective lens 3a of the microscope main body 3. More specifically, the collimator optical system 11 corrects the diameter and beam divergence of the pulsed laser light L such that the diameter is substantially equal to the pupil diameter at the pupil position of the objective lens 3a.

In this embodiment, the beam-shaping optical system (reflected-light generator) 8 and the collimator optical system 11 reflect a part of the pulsed laser light L entering therein.

Figure 2:
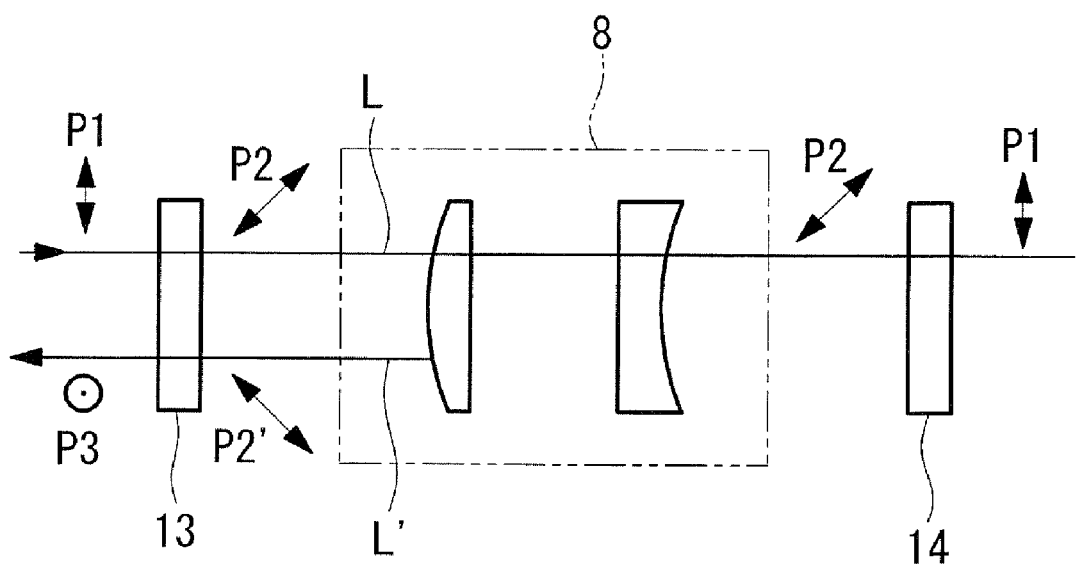
FIG. 2 shows the polarization state of laser light in a beam-shaping optical system of the optical device shown in FIG. 1.

As shown in FIG. 2, the $\lambda/4$ wave plates 13 and 15 disposed in the preceding stages of the beam-shaping optical system 8 and the collimator optical system 11, respectively, convert the pulsed laser light L entering the beam-shaping optical system 8 and the collimator optical system 11 from linearly polarized light P1 into circularly polarized light P2 and convert the reflected pulsed laser light L' reflected by the beam-shaping optical system 8 and the collimator optical system 11 from circularly polarized light P2' into linearly polarized light P3. At this time, because the rotation direction of the circularly polarized light P2' is reversed with respect to the circularly polarized light P2 because of the reflection, when the reflected pulsed laser light L' is converted from the circularly polarized light P2' into the linearly polarized light P3 by the $\lambda/4$ wave plate 13, the polarization direction is rotated by 90° with respect to the incident pulsed laser light L.

Because the $\lambda/4$ wave plate 14 disposed in the subsequent stage of the beam-shaping optical system 8 allows the pulsed laser light L, which has been converted into the circularly polarized light P2 by the $\lambda/4$ wave plate 13 disposed in the preceding stage, to pass therethrough as it is, it is possible to allow the linearly polarized light P1 having the same polarization direction as the incident pulsed laser light L to enter the acousto-optic device 9 in the subsequent stage.

The microscope main body 3 includes a scanner 17 that two-dimensionally scans the pulsed laser light L transmitted from the optical system 5, a pupil projector lens 18 that transmits and focuses the scanned pulsed laser light L, an imaging lens 19, the objective lens 3a, a dichroic mirror 20 that separates the pulsed laser light L from fluorescence F emitted from the specimen A and collected by the objective lens 3a, a photodetector 23 that detects the fluorescence F having passed through a barrier filter 21 and a focus lens 22, and an image-processing unit 24 that forms a fluorescence image according to signals from the photodetector 23.

The operation of the optical device 1 according to this embodiment, configured as described above, will be described below.

In the optical device 1 according to this embodiment, the pulsed laser light L whose optical axis has been corrected by the alignment-adjusting optical system 7 and whose diameter has been adjusted by the beam-shaping optical system 8 is allowed to enter the crystal of the acousto-optic device 9 without any loss. As shown in FIG. 2, the pulsed laser light L entering the acousto-optic device 9 is allowed to pass through the two $\lambda/4$ wave plates 13 and 14, whereby the polarization direction thereof is maintained in the linearly polarized state, the same as it was emitted from the laser light source 4. Thus, it is possible to allow the pulsed laser light L to enter the acousto-optic device 9, while maintaining the proper linearly polarized state, the same as it was emitted, and to properly perform modulation of the pulsed laser light L in the acousto-optic device 9.

A part of the pulsed laser light L is reflected at the beam-shaping optical system 8 and the collimator optical system 11, is allowed to pass through the same λ/4 wave plates 13 and 15, and is sent back to the laser light source 4 in the form of the linearly polarized pulsed laser light L' whose polarization direction differs from that of the incident pulsed laser light L by 90°. Such linearly polarized pulsed laser light L' whose polarization direction differs by 90° can be easily blocked by a Brewster window (not shown) or the like provided in the laser light source 4. Thus, it is possible to assuredly prevent the linearly polarized pulsed laser light L' from returning to the laser light source 4, thus preventing destabilization of laser oscillation from occurring.

In particular, there is an advantage in that, by employing a pulsed laser light source that oscillates subpicosecond extremely short pulsed laser light or a laser diode as the laser light source 4, even when using such a laser light source 4, in which destabilization of laser oscillation due to reflected return light tends to occur, it is possible to assuredly block the reflected return light.

Compared to an optical isolator, the λ/4 wave plates 13 and 15 are advantageous in that they have a simple structure, are available at low cost, assuredly block reflected return light, do not exert a negative influence on the surroundings because they do not utilize magnetic force, and have small group-velocity delay dispersions.

Although the pulsed laser light L having passed through the λ/4 wave plate 15 enters the microscope main body 3 as circularly polarized light, there is no problem because the two-photon excitation effect itself does not depend on the polarization.

In this embodiment, the acousto-optic device 9 is described as an example of a polarization-dependent element, and it is ensured that the linearly polarized light enters the acousto-optic device 9. However, instead of this, a polarization-dependent element may be applied to an SHG microscope 30, as shown in FIG. 3.

Figure 3:
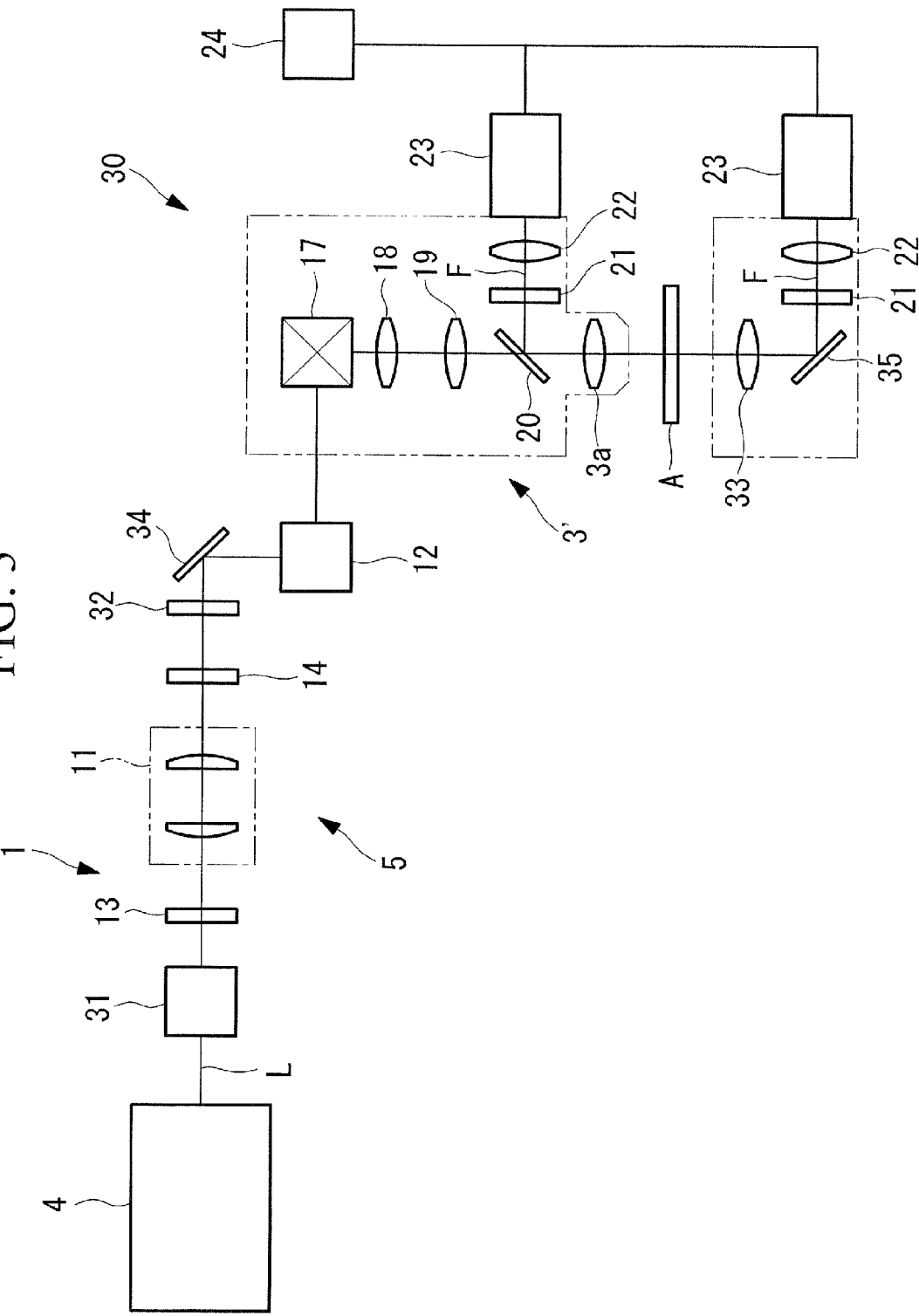
FIG. 3 shows the overall configuration of an SHG microscope to which a modification of the optical device shown in FIG. 1 is applied.

In FIG. 3, reference numeral 31 denotes an output modulator, reference numeral 32 denotes a λ/2 wave plate that rotates the direction of the linearly polarized light while maintaining the linearly polarized light, reference numeral 33 denotes a condenser lens, and reference numerals 34 and 35 denote mirrors.

In the SHG microscope 30, only the collimator optical system 11 serves as the reflected-light generator. Thus, by disposing the λ/4 wave plates 13 and 14 such that the collimator optical system 11 is disposed therebetween, similarly to the above-described embodiment, it is possible to maintain the linearly polarized state of the pulsed laser light L entering the microscope main body 3' and to enable the reflected return light returning to the laser light source 4 to be assuredly blocked.

Figure 4:
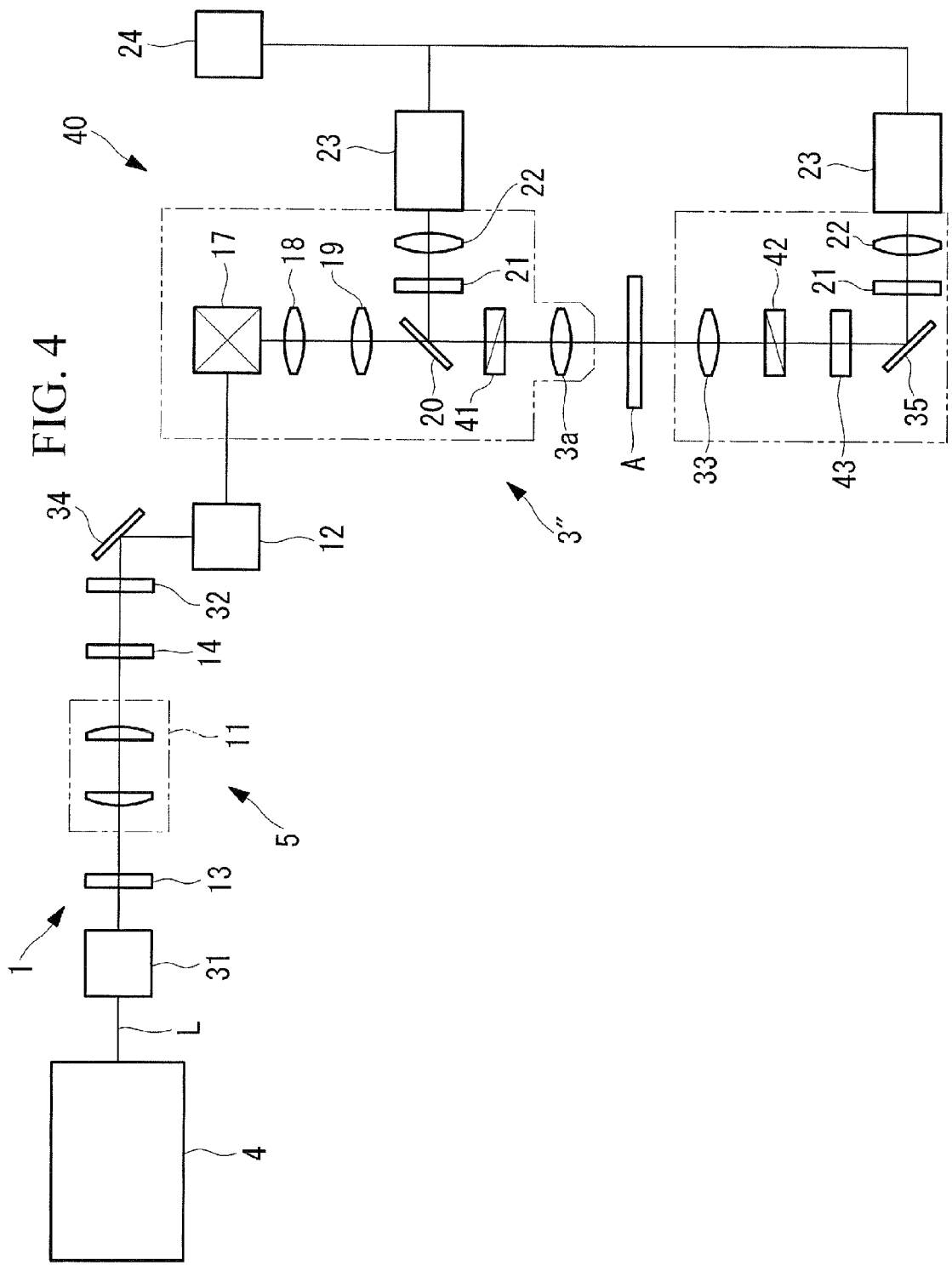
FIG. 4 shows the overall configuration of a differential interference microscope to which another modification of the optical device shown in FIG. 1 is applied.

Alternatively, as shown in FIG. 4, a polarization-dependent element may be applied to a differential interference microscope 40.

In FIG. 4, reference numeral 41 denotes an illumination-side differential interference element, reference numeral 42 denotes an observation-side differential interference element, and reference numeral 43 denotes a polarization element.

This makes it possible to maintain the linearly polarized state of the incident pulsed laser light L entering a microscope main body 3" of the differential interference microscope 40 that serves as the polarization-dependent element. In addition, it is possible to assuredly prevent the pulsed laser light reflected by the collimator optical system 11 from returning to the laser light source 4.

The present invention has advantages in that it is low cost, does not exert a negative influence on the surroundings, has a small group-velocity delay dispersion, blocks the reflected return light effectively so that the laser light does not return to the laser light source, and allows the properly polarized laser light to enter a polarization-dependent element in the subsequent stage.

What is claimed is:

1. A system comprising:
a laser light source oscillating extremely short pulsed laser light;
an optical system configured to transmit laser light emitted from the laser light source, the optical system comprising at least one of a beam-shaping optical system and a collimator optical system, and the optical system comprising a reflected-light generator configured to reflect a part of the transmitted laser light;
a polarization-dependent element disposed downstream of the optical system into which the laser light transmitted by the optical system enters, wherein characteristics of outgoing light are changed in accordance with a polarization state of incident light;
a first λ/4 wave plate disposed between the laser light source and the reflected-light generator; and
a second λ/4 wave plate configured to be fixed so as to maintain a relative direction around an optical axis with respect to the first λ/4 wave plate, wherein the second λ/4 wave plate is disposed between the reflected-light generator and the polarization-dependent element; and
a microscope main body comprising a scanner that scans the laser light two-dimensionally, an objective lens that focuses the laser light on a specimen, and a photodetector that detects light from the specimen caused by the laser light;
wherein the microscope main body is a multi-photon excitation microscope and is disposed downstream of the second λ/4 wave plate;
wherein the laser light emitted from the second λ/4 wave plate comprises a linearly polarized light; and
wherein the polarization-dependent element is an acousto-optic device and is disposed between the second λ/4 wave plate and the scanner of the microscope main body.

2. The system according to claim 1, wherein the reflected-light generator includes a lens optical system.

3. The system according to claim 1, wherein at least one of the beam-shaping optical system and the collimator optical system of the optical system comprises a lens optical system.

4. A system comprising:
a laser light source oscillating extremely short pulsed laser light;
an optical system configured to transmit laser light emitted from the laser light source, the optical system comprising at least one of a beam-shaping optical system and a collimator optical system, and the optical system comprising a reflected-light generator configured to reflect a part of the transmitted laser light;
a polarization-dependent element disposed downstream of the optical system into which the laser light transmitted by the optical system enters, wherein characteristics of outgoing light are changed in accordance with a polarization state of incident light;
a first λ/4 wave plate disposed between the laser light source and the reflected-light generator; and
a second λ/4 wave plate configured to be fixed so as to maintain a relative direction around an optical axis with respect to the first λ/4 wave plate, wherein the second λ/4 wave plate is disposed between the reflected-light generator and the polarization-dependent element; and a microscope main body comprising a scanner that scans the laser light two-dimensionally, an objective lens that focuses the laser light on a specimen, and a photodetector that detects light from the specimen caused by the laser light;

wherein the microscope main body is a second-harmonic generation microscope and is disposed downstream of the second λ/4 wave plate;

wherein the laser light emitted from the second λ/4 wave plate comprises a linearly polarized light; and wherein the polarization-dependent element is disposed between the second λ/4 wave plate and the scanner and includes a polarized direction rotating unit that rotates a direction of the linearly polarized light while maintaining the linearly polarized light.

5. The system according to claim 4, wherein the reflected-light generator includes a lens optical system.

6. The optical device according to claim 4, wherein at least one of the beam-shaping optical system and the collimator optical system in the optical system comprises a lens optical system.

7. A system comprising:

a laser light source oscillating extremely short pulsed laser light;

an optical system configured to transmit laser light emitted from the laser light source, the optical system comprising at least one of a beam-shaping optical system and a collimator optical system, and the optical system comprising a reflected-light generator configured to reflect a part of the transmitted laser light;

a polarization-dependent element disposed downstream of the optical system into which the laser light transmitted by the optical system enters, wherein characteristics of outgoing light are changed in accordance with a polarization state of incident light;

a first λ/4 wave plate disposed between the laser light source and the reflected-light generator; and a second λ/4 wave plate configured to be fixed so as to maintain a relative direction around an optical axis with respect to the first λ/4 wave plate, wherein the second λ/4 wave plate is disposed between the reflected-light generator and the polarization-dependent element; and a microscope main body comprising a scanner that scans the laser light two-dimensionally, an objective lens that focuses the laser light on a specimen, and a photodetector that detects light from the specimen caused by the laser light;

wherein the microscope main body is a differential interference microscope including an illumination-side differential interference element and an observation-side differential interference element; and wherein the polarization-dependent element is the illumination-side differential interference element.

8. The system according to claim 7, wherein the reflected-light generator includes a lens optical system.

9. The system according to claim 7, wherein at least one of the beam-shaping optical system and the collimator optical system in the optical system comprises a lens optical system.

* * * * *